(12) United States Patent
Gong et al.

(10) Patent No.: US 12,470,868 B2
(45) Date of Patent: Nov. 11, 2025

(54) SIGNAL PROCESSING METHOD, APPARATUS AND ELECTRONIC DEVICE

(71) Applicant: Lenovo (Beijing) Limited, Beijing (CN)

(72) Inventors: Yongyan Gong, Beijing (CN); Zhijian Mo, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 195 days.

(21) Appl. No.: 18/161,346

(22) Filed: Jan. 30, 2023

(65) Prior Publication Data
US 2023/0247358 A1      Aug. 3, 2023

(30) Foreign Application Priority Data

Jan. 30, 2022   (CN) .......................... 202210113477.5

(51) Int. Cl.
*H04R 3/04*   (2006.01)
*H03G 5/02*   (2006.01)

(52) U.S. Cl.
CPC .............. *H04R 3/04* (2013.01); *H03G 5/025* (2013.01); *H04R 2430/01* (2013.01)

(58) Field of Classification Search
CPC ....... H04R 3/04; H04R 2430/01; H03G 5/025

USPC .............................. 381/98–99, 104–109, 103
See application file for complete search history.

(56) References Cited

U.S. PATENT DOCUMENTS

| | | | | |
|---|---|---|---|---|
| 5,172,358 | A  * | 12/1992 | Kimura ................. | H03G 5/005 381/108 |
| 8,989,404 | B2 * | 3/2015 | De Poortere .......... | H04R 3/007 381/104 |
| 9,985,595 | B2 * | 5/2018 | You ....................... | H03G 9/025 |
| 11,190,875 | B2 * | 11/2021 | Jeong .................... | H03G 7/007 |
| 11,431,312 | B2 * | 8/2022 | Bongiovi ............... | H03G 9/025 |
| 2022/0050702 | A1 * | 2/2022 | Arya .................... | G06F 9/45558 |

FOREIGN PATENT DOCUMENTS

| | | |
|---|---|---|
| CN | 103262409 A | 8/2013 |
| CN | 111966322 A | 11/2020 |

* cited by examiner

*Primary Examiner* — Disler Paul
(74) *Attorney, Agent, or Firm* — ANOVA LAW GROUP, PLLC

(57) ABSTRACT

A signal processing method includes: obtaining an audio signal; in response to a first control signal, performing a first processing on the audio signal to obtain a first audio signal, the first processing being used to adjust a volume gain of the audio signal; based on the first control signal, performing a second processing on the first audio signal to obtain a second audio signal, the second processing being used to adjust a frequency gain of the first audio signal; and performing an audio post-processing on the second audio signal.

16 Claims, 8 Drawing Sheets

SIGNAL PROCESSING METHOD, APPARATUS AND ELECTRONIC DEVICE

CROSS-REFERENCE TO RELATED APPLICATION

This application claims priority to Chinese Patent Application No. 202210113477.5, filed on Jan. 30, 2022, the entire content of which is incorporated herein by reference.

TECHNICAL FIELD

The present disclosure relates to the technical field of signal processing technologies and, more particularly, to a signal processing method, a signal processing apparatus, and an electronic device.

BACKGROUND

In a portable device, due to a limited size of the portable device, a speaker system thereof has a limited design space, resulting in relatively poor low-frequency performance of sound. In addition, a sensitivity of human ears to low-frequency signals is different at various loudness levels. When a loudness level is relatively low, perception of the low-frequency signals is relatively weak. FIG. 1 is an equal-loudness curve diagram of a sound signal. As shown in FIG. 1, the horizontal axis represents the frequency, and the vertical axis represents the loudness level. The loudness level of the sound signal is close to the real loudness level at a frequency of about 1,500 Hz. For example, FIG. 1 includes a curve corresponding to the loudness level of 30. Assuming that the loudness level of the sound signal at the frequency of about 1,500 Hz perceived by the human ears is a first volume. For the sound signal at the frequency of about 100 Hz, if the loudness level of the low-frequency sound signal perceived by the human ears remains to be the first volume, the corresponding sound pressure level is required to be about 45. That is, at the same volume, the sense of volume of the low-frequency sound signal is lower than that of the middle-frequency sound signal.

SUMMARY

One aspect of the present disclosure provides a signal processing method. The signal processing method includes: obtaining an audio signal; in response to a first control signal, performing a first processing on the audio signal to obtain a first audio signal, the first processing being used to adjust a volume gain of the audio signal; based on the first control signal, performing a second processing on the first audio signal to obtain a second audio signal, the second processing being used to adjust a frequency gain of the first audio signal; and performing an audio post-processing on the second audio signal.

Another aspect of the present disclosure provides a signal processing apparatus. The signal processing apparatus includes at least one memory storing program instructions and at least one processor coupled to the at least one memory. When being executed by the at least one processor, the program instructions cause the at least one processor to: obtain an audio signal; in response to a first control signal, perform a first processing on the audio signal to obtain a first audio signal, the first processing being used to adjust a volume gain of the audio signal; based on the first control signal, perform a second processing on the first audio signal to obtain a second audio signal, the second processing being used to adjust a frequency gain of the first audio signal; and perform an audio post-processing on the second audio signal.

Another aspect of the present disclosure provides an electronic device. The electronic device includes a signal processing apparatus. The signal processing apparatus includes at least one memory storing program instructions and at least one processor coupled to the at least one memory. When being executed by the at least one processor, the program instructions cause the at least one processor to: obtain an audio signal; in response to a first control signal, perform a first processing on the audio signal to obtain a first audio signal, the first processing being used to adjust a volume gain of the audio signal; based on the first control signal, perform a second processing on the first audio signal to obtain a second audio signal, the second processing being used to adjust a frequency gain of the first audio signal; and perform an audio post-processing on the second audio signal.

BRIEF DESCRIPTION OF THE DRAWINGS

To more clearly illustrate the technical solution of the present disclosure, the accompanying drawings used in the description of the disclosed embodiments are briefly described below. The drawings described below are merely some embodiments of the present disclosure. Other drawings may be derived from such drawings by a person with ordinary skill in the art without creative efforts and may be encompassed in the present disclosure.

DETAILED DESCRIPTION OF THE EMBODIMENTS

In order to make the objectives, technical solutions, and advantages of the present disclosure clearer, the present disclosure will be further described in detail below with reference to the accompanying drawings. Obviously, the described embodiments are only some of the embodiments of the present disclosure, not all of the embodiments. Based on the embodiments of the present disclosure, all other embodiments obtained by those of ordinary skill in the art without creative efforts shall fall within the scope of the present disclosure.

In the description of the embodiments of the present disclosure, it should be noted that, unless otherwise stated and limited, the term "connection" should be understood in a broad sense, for example, it may be an electrical connection, an internal communication between two components, or a direct connection, and may also be indirectly connected through an intermediate medium. Those of ordinary skill in the art could understand the specific meanings of the above term according to specific situations.

It should be noted that the terms such as "first\second\third" involved in the embodiments of the present disclosure are only used to distinguish similar objects, and do not represent a specific ordering of the objects. It is understood that the terms such as "first\second\third" may be interchanged in a specific order or sequence where permitted. It should be understood that the objects distinguished by the terms such as "first\second\third" distinctions may be interchanged under appropriate circumstances so that the embodiments of the present disclosure described herein may be practiced in sequences other than those illustrated or described herein.

The embodiments of the present disclosure may be applied to an electronic device. The present disclosure does not limit a product form of the electronic device. The electronic device may include but is not limited to a smart phone, a tablet computer, a wearable device, a personal computer (PC), and a notebook computer, etc. The electronic device may be chosen according to practical application requirements.

Figure 1:
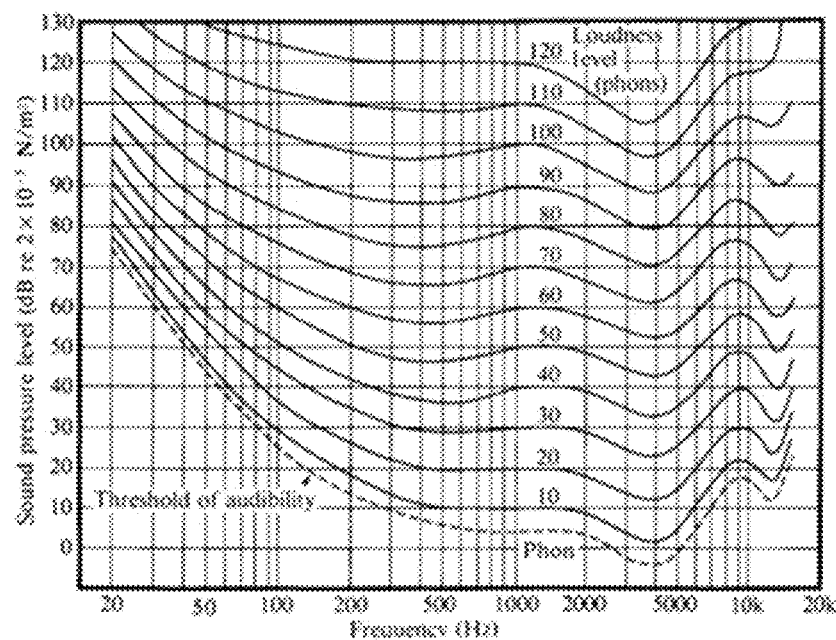
FIG. 1 is an equal-loudness curve diagram of a sound signal in the prior art.
Figure 2:
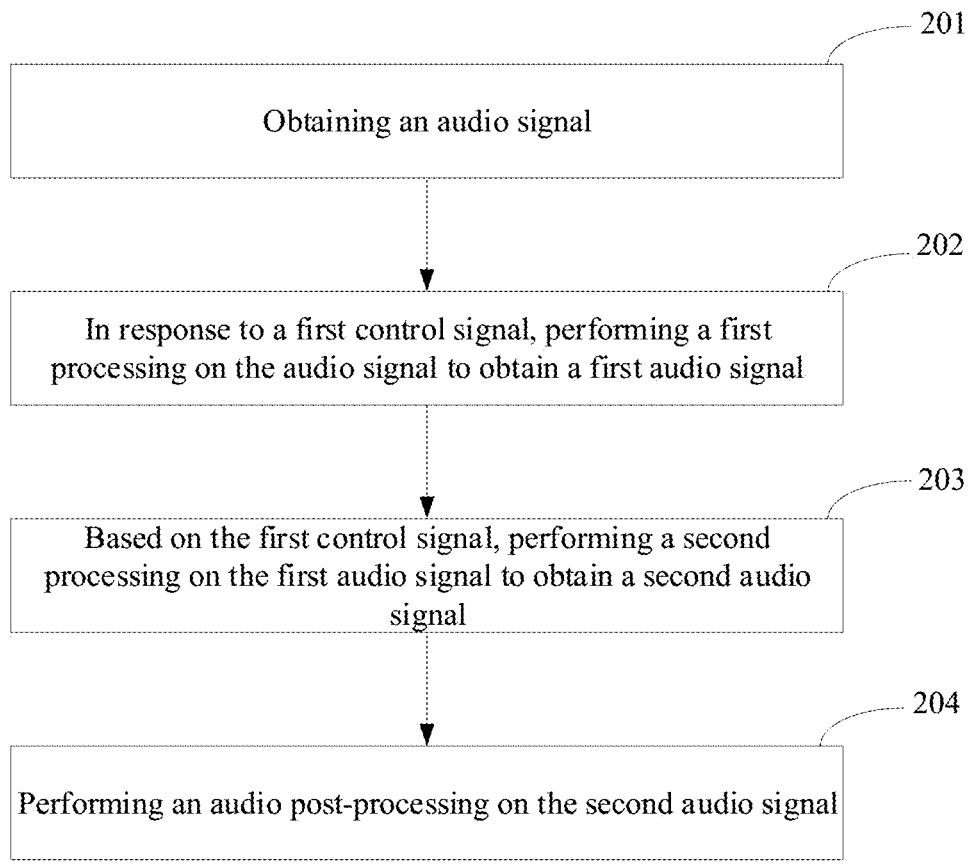
FIG. 2 is a flowchart of an exemplary signal processing method according to some embodiments of the present disclosure.

FIG. 2 is a flowchart of an exemplary signal processing method according to some embodiments of the present disclosure. As shown in FIG. 2, the signal processing method may include the following processes.

At 201, an audio signal is obtained.

Before the electronic device outputs the audio signal, an original audio signal is obtained. The original audio signal is processed before being outputted. The processing may include code-modulation and signal-gain-modulation, etc. In this case, the audio signal refers to the original audio signal without any processing. The audio signal may also be called a sound signal.

The audio signal may be obtained in various manners. For example, the audio signal may be obtained as a buffered audio signal or a real-time system audio signal. The real-time system audio signal refers to an audio signal on which a system central processing unit (CPU) performs some basic processing in real-time. The processed audio signal is then sent to an executer of the signal processing method provided by the embodiments of the present disclosure. The executer may be, for example, Windows operation system audio processing unit (i.e., audio processing objects APO). In this case, because the CPU needs to processes the audio signal in real-time, this solution needs to occupy some CPU resource. For the buffered audio signal, the CPU only performs intermittent data transfer. For example, for every 2 seconds, the CPU wakes up to transfer the original audio data and immediately enters a power-saving sleep mode. The original audio data is directly sent to a digital signal processing (DSP) without any processing. The DSP performs basic processing such as the code-modulation on the original audio data before being sent to the executer of the signal processing method provided by the embodiments of the present disclosure. In this case, because the DSP performs the basic processing on the audio signal and the CPU only sends the audio data, the solution occupies no or little CPU resource. The buffered audio signal or the real-time system audio signal may be processed differently, which will be described in details below in the following embodiments.

After 201, 202 is performed.

At 202, in response to a first control signal, a first processing is performed on the audio signal to obtain a first audio signal. The first processing is performed to adjust volume gain of the audio signal.

The first control signal is a control signal to adjust a system volume level. For example, the system volume level is adjusted from 100% to 80%. The first control signal may be a control signal to turn up the system volume level or a control signal to turn down the system volume level. The present disclosure does not limit a trigger method of the first control signal. The first control signal may be triggered by a physical button or may be triggered by a voice command or a control signal sent by a remote control device.

After the first control signal is obtained, the first processing is performed by a system on the audio signal. That is, the volume gain of the audio signal is adjusted based on the first control signal. The system may be an operating system of the electronic device. For example, the audio processing unit (APO) of the operating system as previously described performs the first processing on the audio signal. That is, an output volume of the audio signal is controlled according to the determined system volume level to satisfy volume requirement of a user. The system volume level represents a gain range of the gain processing performed by the audio processing unit on the audio signal, and may be automatically set by the user according the needs. Different system volumes (volume levels) correspond to different gain ranges. For example, when the system volume level is 100%, the gain range of the gain processing performed by the audio processing unit on the audio signal is about 35%. When the system volume level is 80%, the gain range of the gain processing performed by the audio processing unit on the audio signal is about 10%. When the system volume level is 30%, the gain range of the gain processing performed by the audio processing unit on the audio signal is about −10%.

At 203, a second processing is performed on the first audio signal based on the first control signal to obtain a second audio signal. The second processing is performed to adjust a frequency gain of the first audio signal.

After the volume gain of the audio signal is adjusted based on the first control signal, the frequency gain of the first audio signal also needs to be adjusted to make the sense of volume of the audio signal in each frequency band similar in subsequent audio output effects. It should be noted that the frequency gain adjustment may be performed on signals in some frequency bands of the first audio signal. Because output effects of audio signals in different frequency bands are quite different at different system volume levels, it is necessary to adjust the frequency gain of the audio signals in some frequency bands to make the output effects of the audio signals in each frequency band more coordinated (i.e., uniform).

The second processing performed on the first audio signal will be described in details in the following embodiments.

At 204, an audio post-processing is performed on the second audio signal.

In some embodiments, the related processing of the system volume control is performed before the audio post-processing. After the system volume level is adjusted by the system, subsequent audio processing algorithms (i.e., audio post-processing) may still be performed on the audio signal corresponding to the adjusted system volume level to improve processing effects. In some embodiments, the audio post-processing may be post-processing algorithm by a third-party or the system. The post-processing and subsequent further processing are performed by default at the 100% system volume level without considering differences caused by the system volume level variations.

In the embodiments of the present disclosure, the signal processing method dynamically processes the audio signal based on the system volume level. After the audio signal is differentially processed with different amplitudes (or gains) according to the system volume level, the obtained audio signal is post-processed for normalization. Because the low frequency portion of the audio signal has been gain-compensated based on the system volume level before the post-processing, the subsequent normalization post-processing effects will not generate differentiated output effects due to different system volume levels. Thus, it is ensured that the audio output in each frequency band of the audio signal at various system volume levels provides the user a similar sense of volume, overall audio output is more coordinated, and user's listening experience is improved.

In some embodiments, the first control signal is a volume control signal. The second processing performed on the first audio signal based on the first control signal to obtain the second audio signal may include: extending low-frequency portion of the first audio signal based on the first control signal to expand the frequency bandwidth under the current system volume level.

In some embodiments, the signal processing method maybe implemented by an audio processing software, such as a common audio virtual driver. From the above-described process, it can be understood that the audio virtual driver detects the system volume level in real-time and loads the dynamic equalizer to expand the low-frequency response. An amount of the low-frequency extension may vary with the system volume level. That is, different system volume levels correspond to different amounts of the low-frequency extension. Through the low-frequency extension, the bandwidth (i.e., effective bandwidth) at a certain volume may be substantially improved.

The current system volume level refers to a system volume level after a volume adjustment by the user, that is, a corresponding system volume level after the volume gain of the audio signal is adjusted based on the first control signal.

Figure 3:
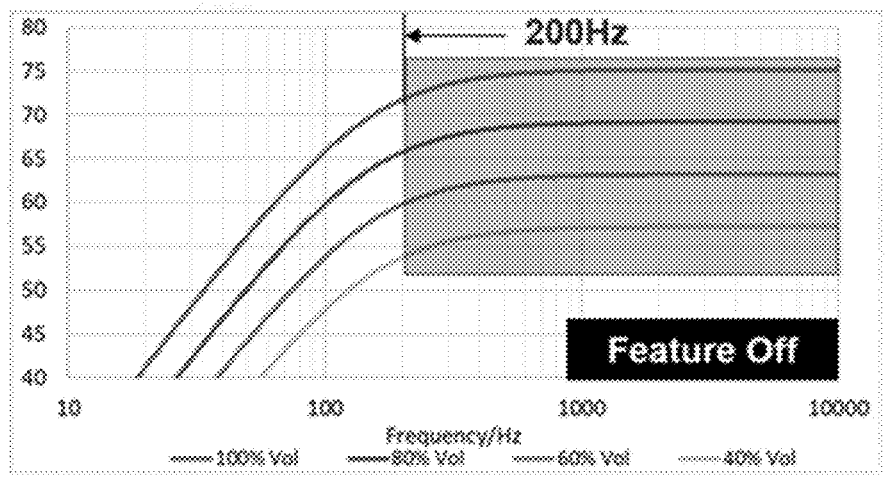
FIG. 3 is a speaker-response curve diagram before an audio signal is processed according to some embodiments of the present disclosure.
Figure 4:
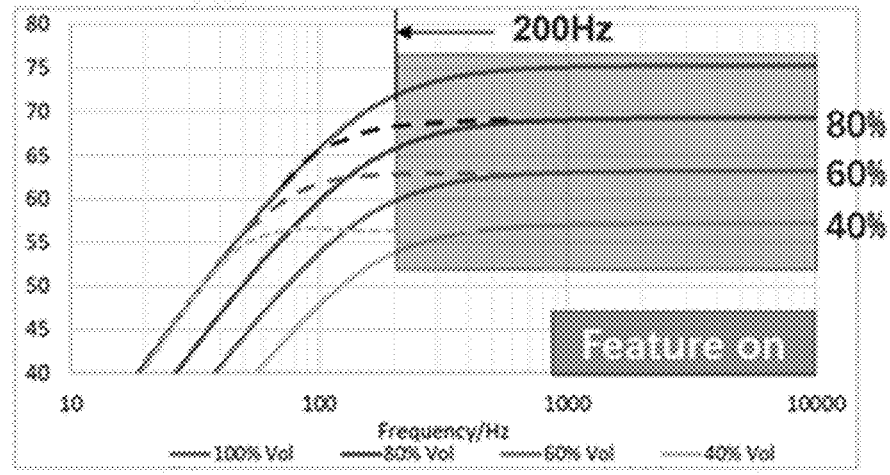
FIG. 4 is a speaker-response curve diagram after an audio signal is processed by a dynamic equalizer according to some embodiments of the present disclosure.

FIG. 3 is a speaker-response curve diagram before an audio signal is processed according to some embodiments of the present disclosure. FIG. 4 is a speaker-response curve diagram after an audio signal is processed by a dynamic equalizer according to some embodiments of the present disclosure. Referring to FIG. 3 and FIG. 4, the horizontal axis represents frequency, and the horizontal axis represents sound pressure level. The four curves correspond to 100% volume, 80% volume, 60% volume, and 40% volume from top to bottom, which are used to illustrate examples of speakers.

Referring to FIG. 3, before the audio processing is performed, regardless of the buffered audio data stream or the real-time system audio stream, the system volume control processing is always performed after the audio data post-processing. Even if the system volume level is turned down, the post-processing algorithm is unable to know in advance that the amplitude of the final output signal has become smaller, and always performs the processing according to the default system volume level of 100%. When the system volume level is relatively low, the amplitude of the corresponding audio signal output to the speaker is also relatively small, as shown in FIG. 3.

Referring to FIG. 4, the user adjusts the system volume level by directly adjusting a volume control gain of the audio virtual driver. When the system volume level is 100%, a sweep frequency of an original 0 dBFS (maximum signal level possible in a digital audio system) signal is ranging between 20 Hz and 10 kHz, as the top curve in FIG. 4. The audio signal in the low-frequency band (between 20 Hz and 200 Hz) is lower than the audio signal (75 dB) in the mid-frequency band by more than 3 dB. Assuming the audio signal above 200 Hz is effective audio signal (the audio signal under 200 Hz drops sharply, and the human ears are insensitive to the audio signal under 200 Hz). When the system volume level is adjusted to 60%, the sweep frequency signal of the original 0 dBFS signal becomes −12 dbFS (for illustration only). However, to provide the user with desired audio quality at low sound volume, the gain in the frequency band between 100 Hz and 200 Hz can be increased (but not exceeding a limit-envelope at 0 dBFS, the limit-envelope being a frequency-response curve at the maximum system volume level), to reach the same 63 dB as the mid-frequency band (corresponding to 60% system volume curve). Thus, the effective frequency band is ranging between 100 Hz and 10 kHz. That is, the effective frequency band is expanded from the range between 200 Hz and 10 kHz to the range between 100 Hz and 10 kHz. At this time, the dynamic equalizer of the post-processing algorithm in the audio virtual driver expands the low-frequency response at the low-frequency range with different gains according to different system volume levels. As shown in FIG. 4, the dashed lines represent the effect of low-frequency extension processing. The low-frequency extension processing is to improve the sound pressure level of the audio signal in the low-frequency band to a louder volume, such that the speaker frequency response curves at different system volume levels enter a "smooth" state at lower frequencies, and extends the effective frequency band toward the low-frequency end, thereby increasing audio signal bandwidth.

Figure 5:
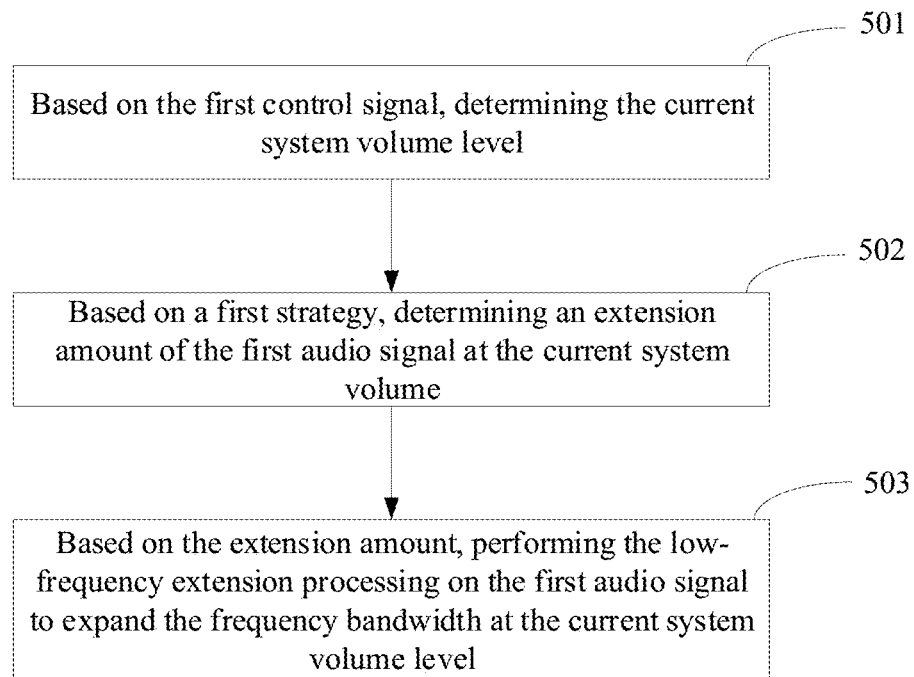
FIG. 5 is a flowchart of a low-frequency extension process according to some embodiments of the present disclosure.

FIG. 5 is a flowchart of a low-frequency extension process according to some embodiments of the present disclosure. As shown in FIG. 5, extending the low-frequency portion of the first audio signal based on the first control signal to expand the frequency bandwidth at the current system volume level includes the following processes.

At 501, the current system volume level is determined based on the first control signal.

Referring to FIG. 4, because different system volume levels correspond to different speaker response curves, specific parameters of the low-frequency extension will be different. In the low-frequency extension process, the current system volume level needs to be determined first.

At 502, an extension amount of the first audio signal at the current system volume level is determined based on a first strategy.

The frequency response curve at the maximum system volume level treated as the limit envelope. For example, a low-frequency effective frequency point is at 200 Hz, and the response sound pressure level below 200 Hz is −12 dB per octave. That is, the response sound pressure level at 100 Hz is 12 dB lower than the response sound pressure level at 200 Hz, and the response sound pressure level at 50 Hz is 12 dB lower than the response sound pressure level at 100 Hz. Assuming the system volume level 60% is 12 dB lower than the system volume level 100%. The effective frequency point at system volume level 60% can be extended from 200 Hz to 100 Hz by increasing the gain below the low-frequency band 200 Hz. In another example, the system volume level 25% is 24 dB lower than the system volume level 100%, and the volume can be extended to 50 Hz low frequency.

The first strategy may have different implementations. For example, the first strategy may include different system volume levels correspond to different adjusted extension amounts of the low-frequency extensions; and/or different frequency band audio signals correspond to different adjusted response values. As shown in FIG. 4, the louder the system volume level, the smaller the low-frequency extension amount (e.g., the frequency band corresponding to the dashed line portion of the 80% system volume curve). The quieter the system volume level, the greater the low-frequency extension amount (e.g., the frequency band corresponding to the dashed line portion of the 40% system volume curve). Referring to FIG. 4, on the other hand, the loudness levels corresponding to different low-frequency audio signals may be adjusted differently. That is, for the system volume curves in FIG. 4, at a same frequency, such as 100 Hz, a magnitude of change when moving a point on the solid line to the dashed line varies with different system volume curves.

At 503, the low-frequency extension processing is performed on the first audio signal based on the extension amount to expand the frequency bandwidth at the current system volume level.

After the extension amount of the first audio signal at the current system volume level is determined, the low-frequency extension processing may be performed on the first audio signal directly based on the extension amount, thereby achieving the effect of the expanding the frequency bandwidth.

Performing the low-frequency extension processing on the first audio signal based on the extension amount may include: performing the low-frequency extension processing on the first audio signal by using the dynamic equalizer. That is, the loudness level of the audio signal in the low-frequency band is increased, such that the speaker response curve at different system volume levels enter the "flat" state in the low-frequency band.

Figure 6:
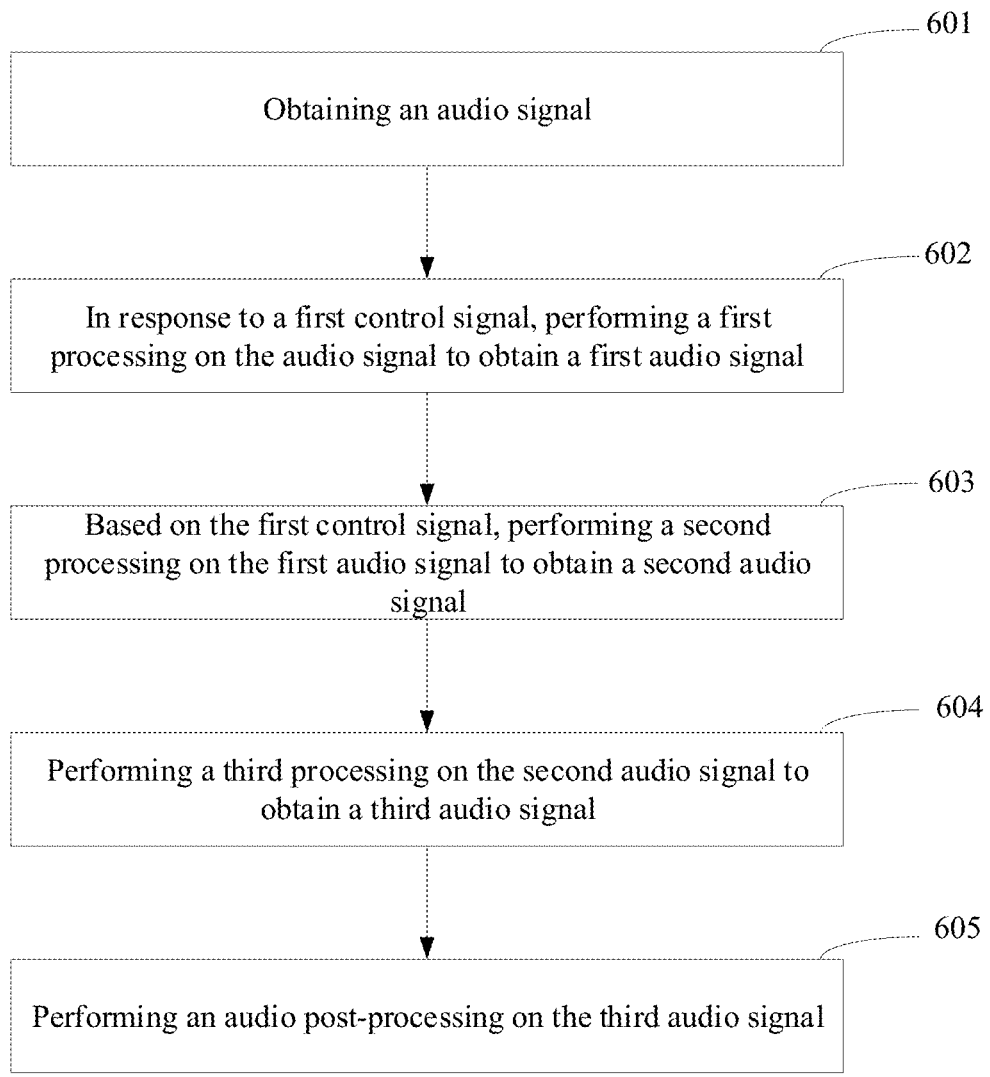
FIG. 6 is a flowchart of another exemplary signal processing method according to some embodiments of the present disclosure.

FIG. 6 is a flowchart of another exemplary signal processing method according to some embodiments of the present disclosure. As shown in FIG. 6, the signal processing method includes the following processes.

At 601, an audio signal is obtained.

At 602, in response to a first control signal, a first processing is performed on the audio signal to obtain a first audio signal. The first processing is used to adjust the volume gain of the audio signal.

At 603, a second processing is performed on the first audio signal based on the first control signal to obtain a second audio signal. The second processing is used to adjust the frequency gain of the first audio signal.

At 604, a third processing is performed on the second audio signal to obtain a third audio signal. The third processing is used to adjust the sound pressure of the second audio signal.

In some embodiments, performing the third processing on the second audio signal to obtain the third audio signal includes: adjusting the response sound pressure level of the low-frequency portion of the second audio signal based on the equal-loudness curve at the current system volume level.

In some embodiments, to further improve the audio output effect, after performing the second processing on the first audio signal to adjust the frequency gain of the first audio signal, the signal processing method further adjusts the sound pressure level of the second audio signal to realize equal-loudness output for various frequency bands of the audio signal, and further realize a same or similar sense of volume perceived by the user for various frequency bands of the audio signal output.

Figure 7:
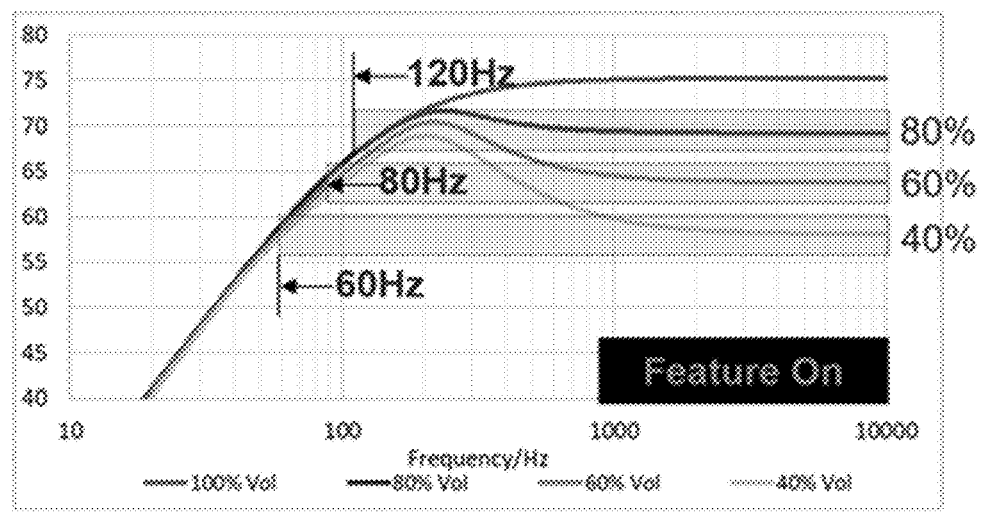
FIG. 7 is a speaker-response curve diagram after an equal-loudness control compensation process according to some embodiments of the present disclosure.

The processing at 604 can be considered as the equal-loudness control compensation of the low-frequency portion of the audio signal. The equal-loudness control compensation makes the sense of volume for the low-frequency sound consistent with the sense of volume for the mid-frequency and the high-frequency sound. Thus, the sense of volume for the low-frequency sound is not lost or weakened when the system volume level is relatively low. After the equal-loudness control compensation, the speaker response curves are shown in FIG. 7.

At 605, an audio post-processing is performed on the third audio signal.

The signal processing method provided by the present disclosure is performed before the audio post-processing. Under the circumstance that the third processing (equal-loudness control compensation processing) is included, the third processing needs to be performed before the audio post-processing. The audio post-processing is performed on the third audio signal obtained from the third processing.

The present disclosure not only extends the low-frequency portion of the audio signal, but also performs the equal-loudness control compensation processing on the audio signal. Thus, the overall output effect of the final output audio data is more natural and balanced, thereby satisfying the user's need and optimizing the user's listening experience.

Figure 8:
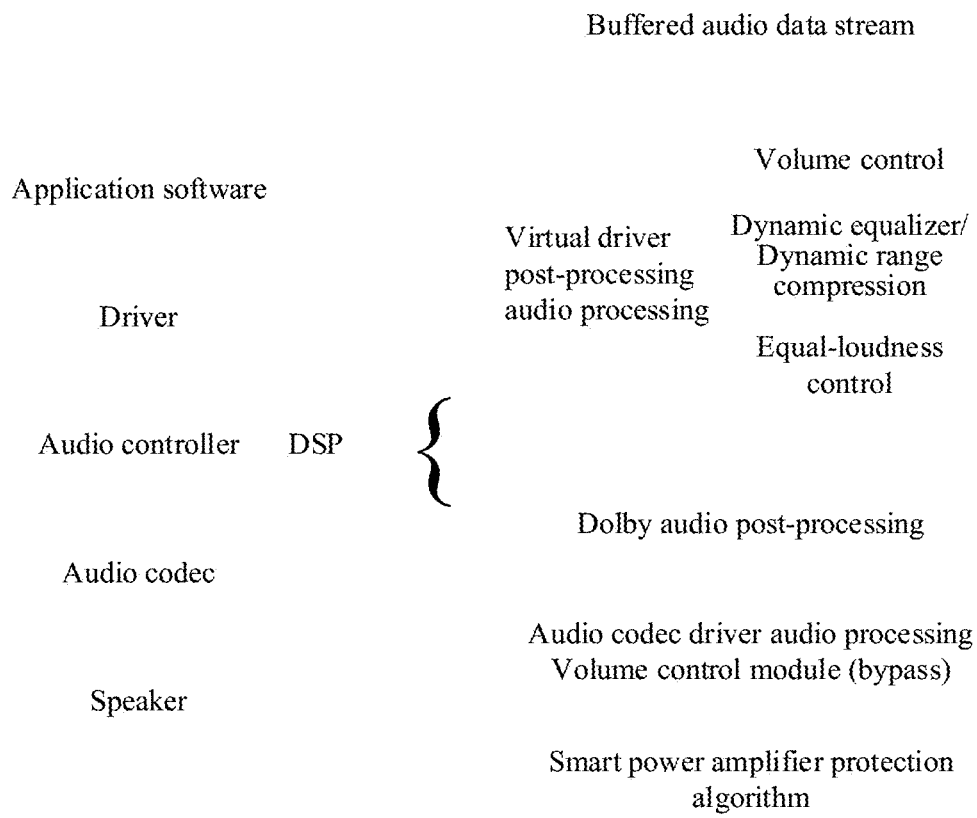
FIG. 8 is a schematic diagram showing operation principle of buffering audio data stream according to some embodiments of the present disclosure.

FIG. 8 is a schematic diagram showing operation principle of buffering audio data stream according to some embodiments of the present disclosure. As shown in FIG. 8, for the buffered audio data stream, the volume control is implemented in the DSP module before and after the method provided by the present disclosure is performed. The difference is that before the method is performed, the volume control is performed after Dolby audio post-processing while the volume control function in the embodiments of the present disclosure is moved upward to an audio processing module of the virtual driver for post-processing (a moving direction indicated by the dashed line in FIG. 8).

Figure 9:
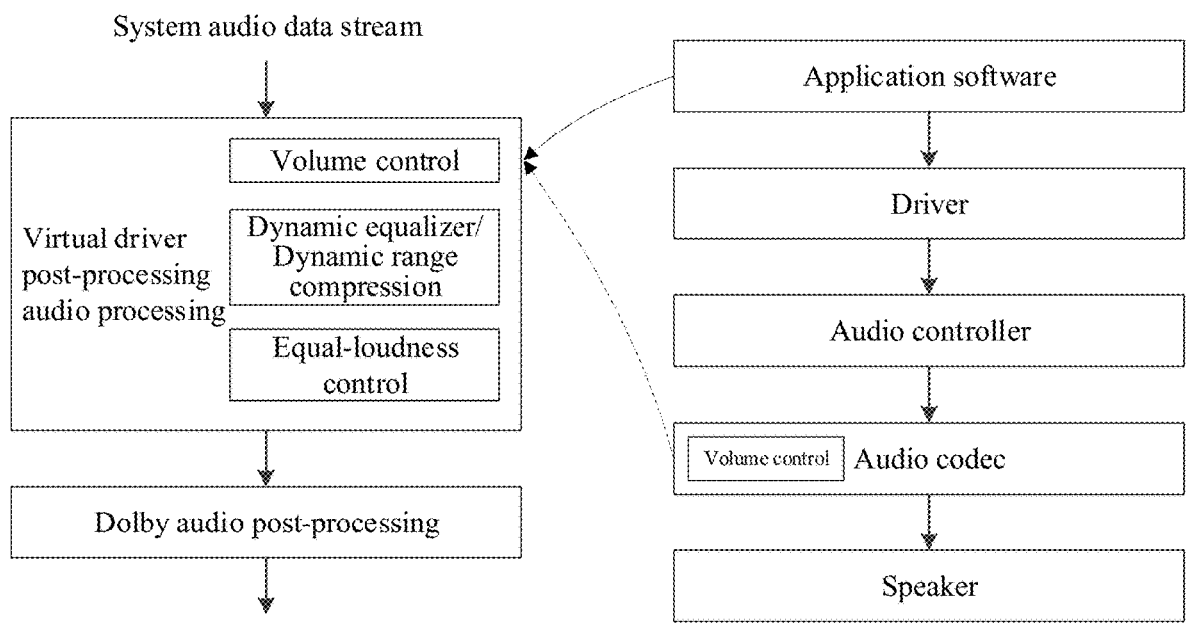
FIG. 9 is a schematic diagram showing operation principle of real-time audio data stream of a system according to some embodiments of the present disclosure.

FIG. 9 is a schematic diagram showing operation principle of real-time audio data stream of a system according to some embodiments of the present disclosure. As shown in FIG. 9, for the real-time audio data stream, the volume control is implemented in the audio codec before the method provided by the present disclosure is performed. In the embodiments of the present disclosure, the volume control function is moved upward to a mode effector of the audio engine (a moving direction indicated by the dashed line in FIG. 9).

Figure 10:
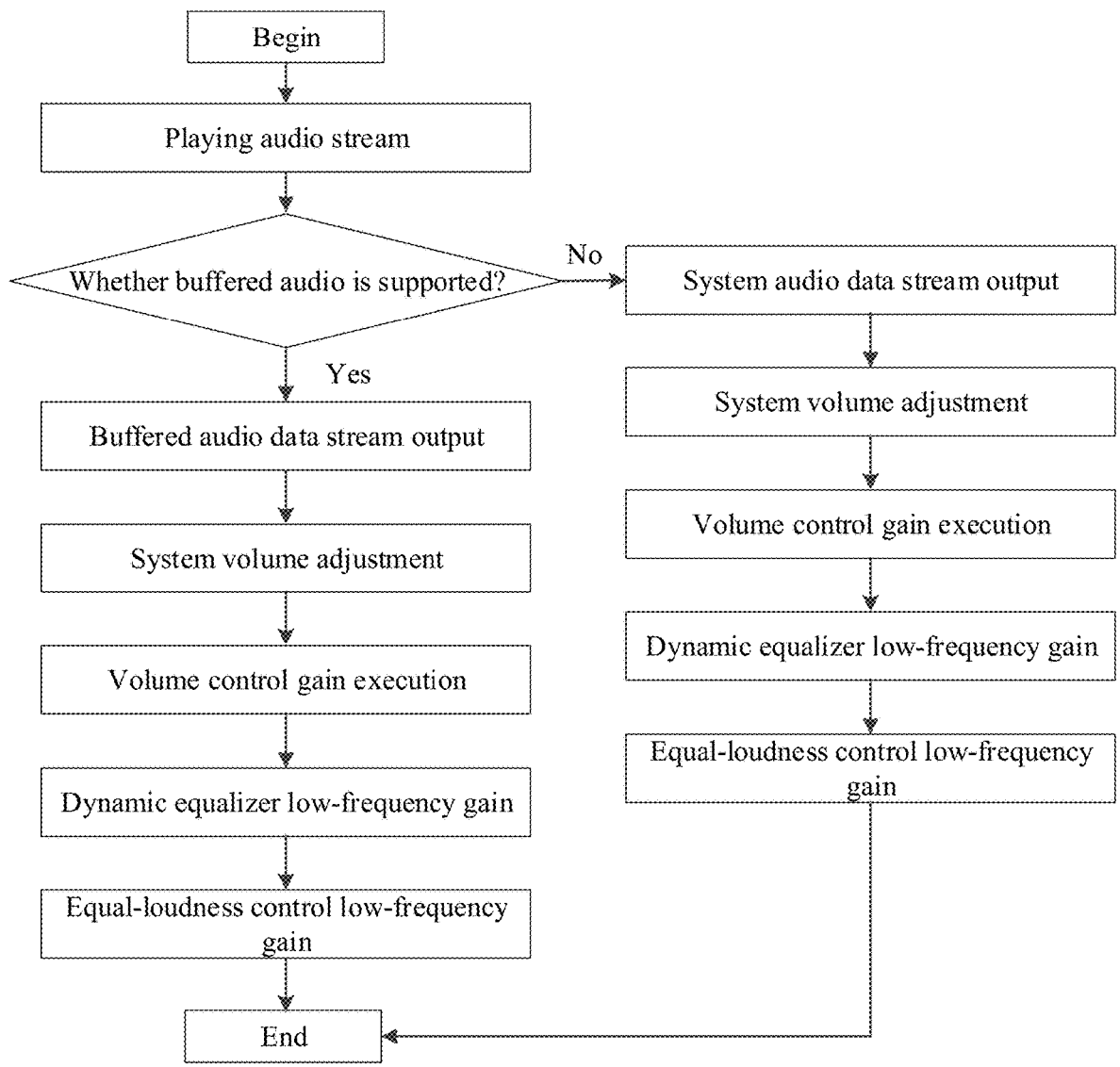
FIG. 10 is a flowchart of another exemplary signal processing method according to some embodiments of the present disclosure.

As for the audio data stream, the audio signal may be obtained differently. FIG. 10 is a flowchart of another exemplary signal processing method according to some embodiments of the present disclosure. The corresponding portions of the above-described embodiments may be comprehended with reference to FIG. 10.

As shown in FIG. 10, "playing the audio stream" corresponds to "obtaining an audio signal" at 201 or 601.

"Whether buffering is supported?" is equivalent to determining whether the audio signal is a buffered audio signal or a real-time system audio signal. If the audio signal is the buffered audio signal, the processing continues along the downward direction arrow. The processing on the buffered audio signal includes: detecting the user adjusted system volume level, and performing the volume control gain processing accordingly, that is, adjusting the system volume level; performing the dynamic equalization low-frequency gain processing, corresponding to 203 and 603 with reference to the description of the embodiments in FIG. 4 and FIG. 5; and performing the equal-loudness control low-frequency gain processing, corresponding to 604 with reference to the description of the embodiments of adjusting the sound pressure level of the second audio signal. The processing along the rightward direction arrow in FIG. 10 is regarding the processing on the real-time system audio signal, which is similar to the processing on the buffered audio signal, and is omitted herein.

For illustration purposes, the above-described method embodiments are expressed as a series of action combinations, but those skilled in the art should know that the present disclosure is not limited by the above-described action sequence, because according to the present disclosure, certain actions/steps may be performed in other orders or simultaneously. Further, those skilled in the art should also know that the embodiments described in the specification belong to preferred embodiments, and the actions and modules involved are not necessarily required by the present disclosure. The signal processing method is described in detail in the embodiments of the present disclosure, and can be implemented by various forms of devices. Thus, the present disclosure also provides a signal processing apparatus, which will be described in detail below with specific embodiments.

Figure 11:
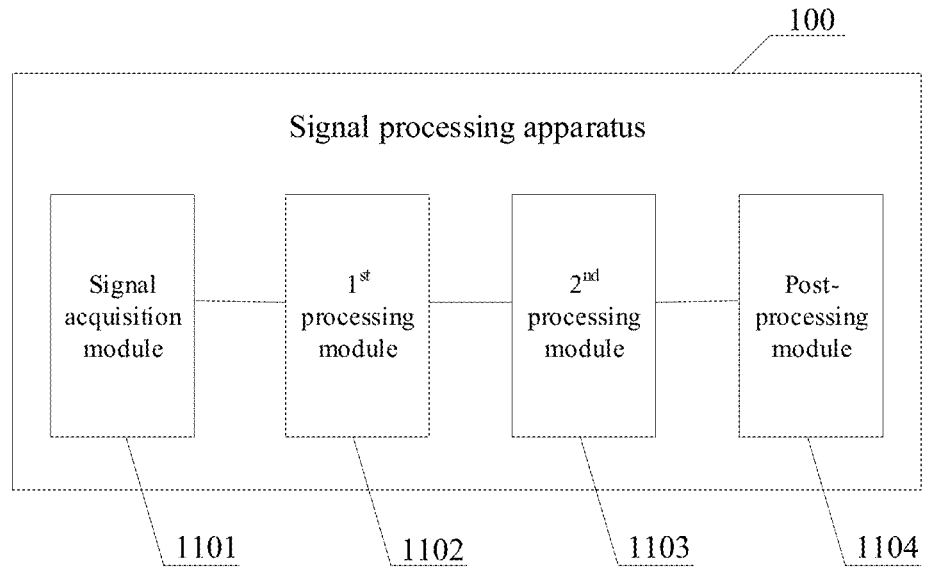
FIG. 11 is a schematic structural diagram of an exemplary signal processing apparatus according to some embodiments of the present disclosure.

FIG. 11 is a schematic structural diagram of an exemplary signal processing apparatus according to some embodiments of the present disclosure. As shown in FIG. 11, the signal processing apparatus 100 includes a signal acquisition module 1101, a first processing module 1102, a second processing module 1103, and a post-processing module 1104.

The signal acquisition module 1101 is configured to obtain the audio signal. The first processing module 1102 is configured to, in response to the first control signal, perform the first processing on the audio signal to obtain the first audio signal. The first processing is used to adjust the volume gain of the audio signal. The second processing module 1103 is configured to perform the second processing on the first audio signal based on the first control signal to obtain the second audio signal. The second processing is used to adjust the frequency gain of the first audio signal. The post-processing module 1104 is configured to perform the audio post-processing on the second audio signal.

In the embodiments of the present disclosure, the signal processing apparatus dynamically processes the audio signal based on the system volume level, such that the audio output for each frequency band in the audio signal at various system volume levels provides the user similar sense of volume. Thus, the overall audio output is coordinated and balanced, and the user's listening experience is improved.

In some embodiments, the first control signal is the volume control signal. The second processing module is used to: based on the first control signal, perform the low-frequency extension processing on the first audio signal to expand the frequency bandwidth at the current system volume level.

In some embodiments, the second processing module further includes: a volume determination module configured to determine the current system volume level based on the first control signal; an extension amount determination module configured to determine the extension amount of the first audio signal at the current system volume level based on the first strategy; an extension processing module configured to perform the low-frequency extension on the first audio signal based on the extension amount to expand the frequency bandwidth at the current system volume level.

In some embodiments, the first strategy includes: different system volume levels corresponding to different extension amounts adjusted in the low-frequency extension processing; and/or audio signals with different frequency bands corresponding to different loudness levels adjusted in the low-frequency extension processing.

In some embodiments, the extension processing module is configured to use the dynamic equalizer to perform the low-frequency extension processing on the first audio signal.

In some embodiments, the signal processing apparatus further includes: a third processing module configured to performing the third processing on the second audio signal to obtain the third audio signal. The third processing is used to adjust the sound pressure level of the second audio signal. As such, the post-processing module is configured to perform the audio post-processing on the third audio signal.

In some embodiments, the third processing module is configured to: adjust the response sound pressure level of the low-frequency portion of the second audio signal based on the equal-loudness curve at the current system volume level.

In some embodiments, the signal acquisition module is configured to: obtain the buffered audio signal or the real-time system audio signal.

The signal processing apparatus in the embodiments of the present disclosure includes a processor and a memory coupled to the processor. The signal acquisition module, the first processing module, the second processing module, the post-processing module, and the third processing module are program modules stored in the memory. When being executed by the processor, the program modules stored in the memory cause the processor to perform the functions thereof.

The processor includes one or more cores. The one or more cores fetch the program modules from the memory, and process returned data through adjusting core parameters.

The memory may include a computer-readable volatile memory such as a random-access memory (RAM), and/or a computer-readable non-volatile memory such as a read-only memory (ROM) or flash RAM. The memory includes at least one memory chip.

The present disclosure also provides a computer-readable storage medium that can be directly loaded to an internal memory of a computer. The computer-readable storage medium contains software codes or computer programs. After the computer programs are loaded to and executed by the computer, the signal processing method provided by the embodiments of the present disclosure can be implemented.

The present disclosure also provides a computer program product that can be directly loaded to the internal memory of a computer. The computer program product contains the software codes or the computer programs. After the computer programs are loaded to and executed by the computer, the signal processing method provided by the embodiments of the present disclosure can be implemented.

Figure 12:
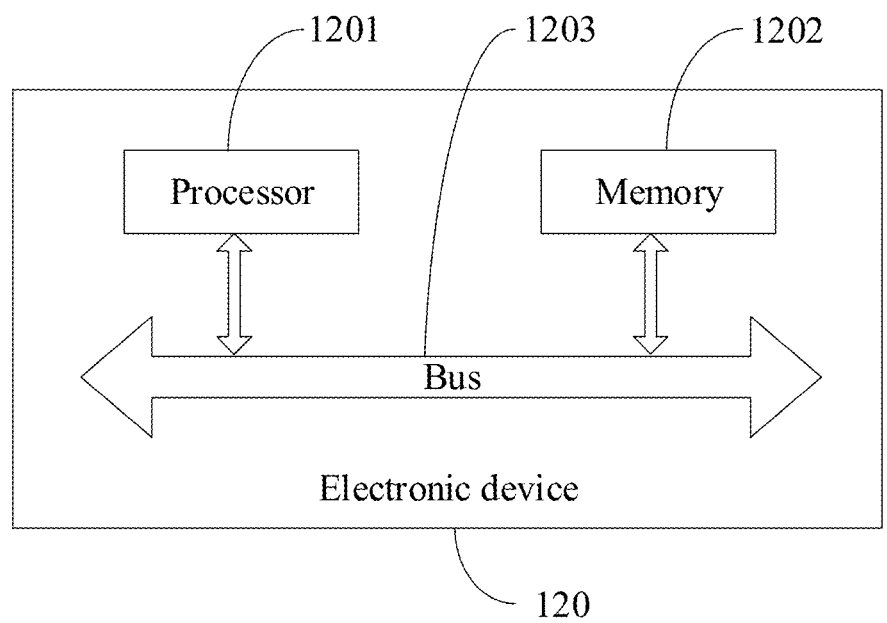
FIG. 12 is a schematic structural diagram of an exemplary electronic device according to some embodiments of the present disclosure.

The present disclosure also provides an electronic device. FIG. 12 is a schematic structural diagram of an exemplary electronic device according to some embodiments of the present disclosure. As shown in FIG. 12, the electronic device 120 includes at least one processor 1201, at least one memory 1202 coupled to the at least one processor 1201, and a bus 1203. The at least one processor and the at least one memory communicate with each other through the bus 1203. The at least one processor id used to call the program instructions in the at least one memory to execute the disclosed signal processing method.

Various embodiments in the specification are described in a progressive manner, and each embodiment focuses on the differences from other embodiments, and for the same and similar parts between the various embodiments, reference can be made to each other. At the same time, the features described in the embodiments in the specification may be replaced or combined with each other, such that those skilled in the art can realize or use the present disclosure. As for the apparatuses and devices disclosed in the embodiments, because of the correspondence to the method disclosed in the embodiments, the descriptions thereof are relatively simple, and reference can be made to the description of the method for relevant parts.

It should also be noted that in the specification, relational terms such as first and second are used only to distinguish one entity or operation from another, and do not necessarily require or imply that there is such actual relationship or order between those entities or operations. Moreover, the terms "comprising," "including" or any other variation thereof are intended to encompass non-exclusive inclusion such that a process, method, article or device comprising a list of elements includes not only those elements, but also includes not explicitly listed or other elements inherent to such a process, method, article or apparatus. Without further limitation, an element qualified by the phrase "comprising a . . . " does not preclude the presence of additional identical elements in a process, method, article or apparatus that includes the element.

Those skilled in the art can further realize that the units and algorithm steps of the examples described in the embodiments disclosed in the specification can be implemented by electronic hardware, computer software, or a combination of both. To clearly illustrate interchangeabilities of hardware and software, the structures and steps of each example have been generally described in the specification in accordance with the functions. Whether these functions are implemented by hardware or software depends on the specific application and design constraints of the technical solution. Those skilled in the art can use different methods for each specific application to implement the described functions, but such implementation should not be considered beyond the scope of this application.

The steps of the method or algorithm described in the embodiments disclosed in the specification can be directly implemented by hardware, a software module executed by a processor, or a combination thereof. The software module can be stored in random access memory (RAM), internal memory, read-only memory (ROM), electrically programmable ROM, electrically erasable programmable ROM, registers, hard disks, removable disks, CD-ROMs, or any other storage media known in the technical field.

The above description of the disclosed embodiments enables those skilled in the art to implement or use this application. Various modifications to these embodiments will be obvious to those skilled in the art, and the general principles defined herein can be implemented in other embodiments without departing from the spirit or scope of the present application. Therefore, this application will not be limited to the embodiments shown in the specification, but should conform to the broadest scope consistent with the principles and novelties disclosed in the specification.

What is claimed is:

1. A signal processing method, comprising:
    obtaining an audio signal;
    in response to a first control signal, performing a first processing on the audio signal to obtain a first audio signal, the first processing being used to adjust a volume gain of the audio signal, the first control signal being a volume control signal;
    based on the first control signal, performing a second processing on the first audio signal to obtain a second audio signal, the second processing being used to adjust a frequency gain of the first audio signal, wherein the performing the second processing on the first audio signal based on the first control signal to obtain the second audio signal includes performing a low-frequency extension processing on the first audio signal based on the first control signal to expand a frequency bandwidth at a current system volume level, and the low-frequency extension processing at the current system volume level is performed prior to an audio post-processing; and
    performing the audio post-processing on the second audio signal,
wherein the performing the low-frequency extension processing on the first audio signal based on the first control signal to expand the frequency bandwidth at the current system volume level includes:
    based on the first control signal, determining the current system volume level;
    based on a first strategy, determining an extension amount of the first audio signal at the current system volume level; and
    based on the extension amount, performing the low-frequency extension processing on the first audio signal to expand the frequency bandwidth at the current system volume level.

2. The signal processing method according to claim 1, wherein the first strategy includes:
    different system volume levels corresponding to different extension amounts adjusted in the low-frequency extension processing; and/or audio signals with different frequency bands corresponding to different loudness levels adjusted in the low-frequency extension processing.

3. The signal processing method according to claim 1, wherein performing the low-frequency extension processing on the first audio signal based on the extension amount includes:
    using a dynamic equalizer to perform the low-frequency extension processing on the first audio signal.

4. The signal processing method according to claim 1, wherein:
    after performing the second processing on the first audio signal based on the first control signal to obtain the second audio signal, the method further includes performing a third processing on the second audio signal to obtain a third audio signal, the third processing being used to adjust a sound pressure level of the second audio signal; and
    performing the audio post-processing on the second audio signal includes performing the audio post-processing on the third audio signal.

5. The signal processing method according to claim 4, wherein performing the third processing on the second audio signal to obtain the third audio signal includes:

adjusting a response sound pressure level of a low-frequency portion of the second audio signal based on an equal-loudness curve at the current system volume level.

6. The signal processing method according to claim 1, wherein:
obtaining the audio signal includes obtaining a buffered audio signal or a real-time system audio signal.

7. The signal processing method according to claim 1, wherein the audio post-processing is associated with a third-party audio post-processing algorithm.

8. The signal processing method according to claim 7, wherein the third-party audio post-processing algorithm comprises Dolby audio post-processing.

9. A signal processing apparatus, comprising:
at least one memory storing program instructions; and
at least one processor coupled to the at least one memory, wherein when being executed by the at least one processor, the program instructions cause the at least one processor to:
obtain an audio signal;
in response to a first control signal, perform a first processing on the audio signal to obtain a first audio signal, the first processing being used to adjust a volume gain of the audio signal, the first control signal being a volume control signal;
based on the first control signal, perform a second processing on the first audio signal to obtain a second audio signal, the second processing being used to adjust a frequency gain of the first audio signal, wherein the performing the second processing on the first audio signal based on the first control signal to obtain the second audio signal includes performing a low-frequency extension processing on the first audio signal based on the first control signal to expand a frequency bandwidth at a current system volume level, and the low-frequency extension processing at the current system volume level is performed prior to an audio post-processing; and
perform the audio post-processing on the second audio signal,
wherein when performing the low-frequency extension processing on the first audio signal based on the first control signal to expand the frequency bandwidth at the current system volume level, the at least one processor is further configured to:
based on the first control signal, determine the current system volume level;
based on a first strategy, determine an extension amount of the first audio signal at the current system volume level; and
based on the extension amount, perform the low-frequency extension processing on the first audio signal to expand the frequency bandwidth at the current system volume level.

10. The signal processing apparatus according to claim 9, wherein the first strategy includes:
different system volume levels corresponding to different extension amounts adjusted in the low-frequency extension processing; and/or audio signals with different frequency bands corresponding to different loudness levels adjusted in the low-frequency extension processing.

11. The signal processing apparatus according to claim 9, wherein when performing the low-frequency extension processing on the first audio signal based on the extension amount, the at least one processor is further configured to:
use a dynamic equalizer to perform the low-frequency extension processing on the first audio signal.

12. The signal processing apparatus according to claim 9, wherein:
after performing the second processing on the first audio signal based on the first control signal to obtain the second audio signal, the at least one processor is further configured to perform a third processing on the second audio signal to obtain a third audio signal, the third processing being used to adjust a sound pressure level of the second audio signal; and
performing the audio post-processing on the second audio signal includes performing the audio post-processing on the third audio signal.

13. The signal processing apparatus according to claim 12, wherein when performing the third processing on the second audio signal to obtain the third audio signal, the at least one processor is further configured to:
adjust a response sound pressure level of a low-frequency portion of the second audio signal based on an equal-loudness curve at the current system volume level.

14. The signal processing apparatus according to claim 9, wherein:
obtaining the audio signal includes obtaining a buffered audio signal or a real-time system audio signal.

15. An electronic device, comprising a signal processing apparatus, wherein the signal processing apparatus includes:
at least one memory storing program instructions; and
at least one processor coupled to the at least one memory, wherein when being executed by the at least one processor, the program instructions cause the at least one processor to:
obtain an audio signal;
in response to a first control signal, perform a first processing on the audio signal to obtain a first audio signal, the first processing being used to adjust a volume gain of the audio signal, the first control signal being a volume control signal;
based on the first control signal, perform a second processing on the first audio signal to obtain a second audio signal, the second processing being used to adjust a frequency gain of the first audio signal, wherein the performing the second processing on the first audio signal based on the first control signal to obtain the second audio signal includes performing a low-frequency extension processing on the first audio signal based on the first control signal to expand a frequency bandwidth at a current system volume level, and the low-frequency extension processing at the current system volume level is performed prior to an audio post-processing; and
perform the audio post-processing on the second audio signal,
wherein when performing the low-frequency extension processing on the first audio signal based on the first control signal to expand the frequency bandwidth at the current system volume level, the at least one processor is further configured to:
based on the first control signal, determine the current system volume level;
based on a first strategy, determine an extension amount of the first audio signal at the current system volume level; and
based on the extension amount, perform the low-frequency extension processing on the first audio signal to expand the frequency bandwidth at the current system volume level.

16. The electronic device according to claim 15, wherein the first strategy includes:

different system volume levels corresponding to different extension amounts adjusted in the low-frequency extension processing; and/or audio signals with different frequency bands corresponding to different loudness levels adjusted in the low-frequency extension processing.

\* \* \* \* \*